Nov. 12, 1968 R. CULLIS 3,411,054

SEMICONDUCTOR SWITCHING DEVICE

Filed April 28, 1965 2 Sheets-Sheet 1

Inventor
ROGER CULLIS
By [signature]
Attorney

Nov. 12, 1968 R. CULLIS 3,411,054

SEMICONDUCTOR SWITCHING DEVICE

Filed April 28, 1965 2 Sheets-Sheet 2

Inventor
ROGER CULLIS
By Percy P. Lantzy
Attorney

United States Patent Office 3,411,054

Patented Nov. 12, 1968

3,411,054

SEMICONDUCTOR SWITCHING DEVICE

Roger Cullis, London, England, assignor to International Standard Electric Corporation, New York, N.Y., a corporation of Delaware Filed Apr. 28, 1965, Ser. No. 451,451
Claims priority, application Great Britain, May 25, 1964, 21,566/64
3 Claims. (Cl. 317—235)

ABSTRACT OF THE DISCLOSURE

This invention is for a four layer semiconductor switching device having two current paths which simulate the effect of two thyristors in parallel wherein all p—n junctions are formed by operations performed from one side of the slice of the semiconductor material, and all metallic ohmic connections are made from the same side of the said slice of semiconductor material.

This invention relates to semiconductor thyristor devices and to methods of making them.

According to the present invention there is provided a method of making a semiconductor device comprising the steps of forming first and second regions of one conductivity type within a third region of high resistivity of the opposite conductivity type in a semiconductor wafer of low resistivity and of said opposite conductivity type, said first and second regions forming separate junctions with said third region, forming a fourth region within said first region and applying metallic contacts to at least said first, second and fourth regions.

Figure 1:
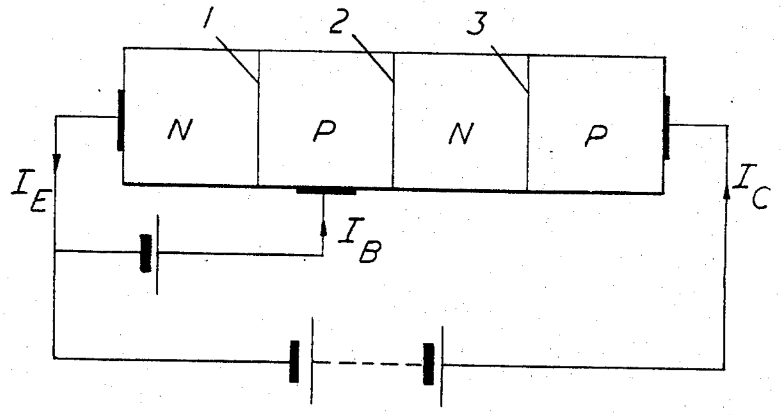
Figure 2:
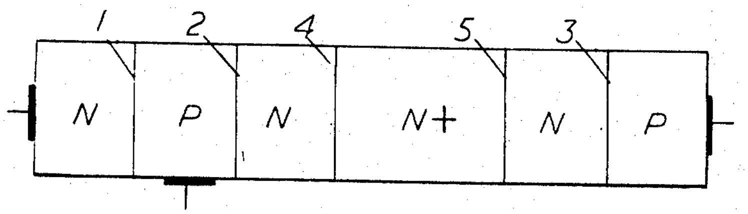
Figure 3:
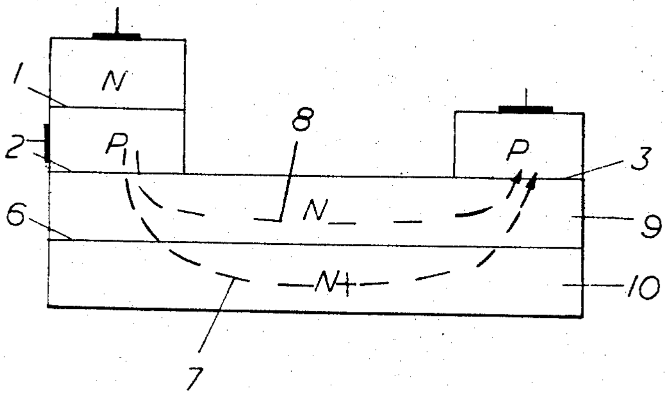
Figure 4:
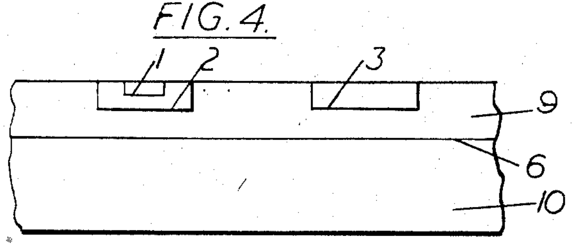
Figure 5:
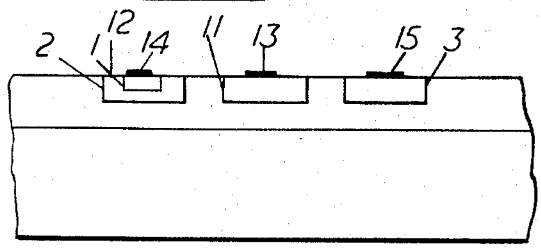
Figure 6:
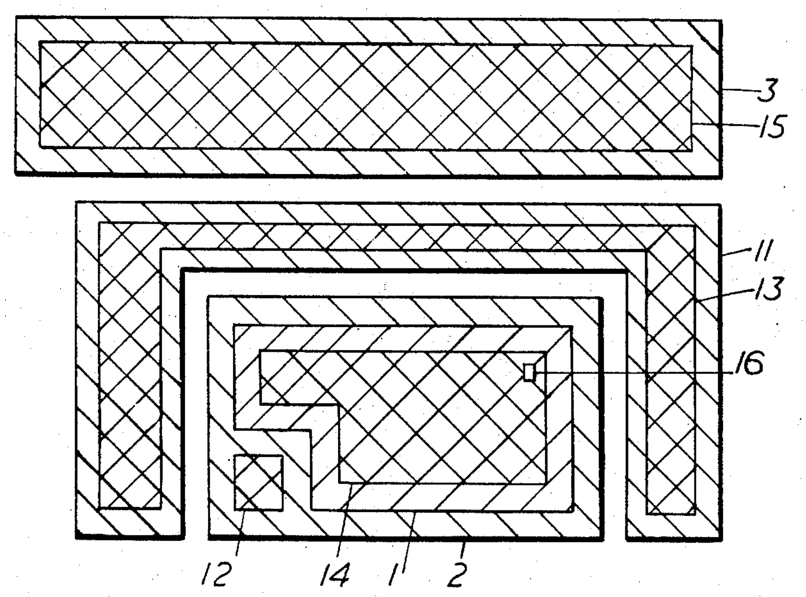

A silicon thyristor, according to the present invention, will now be described with reference to the accompanying drawings, in which:

FIG. 1 represents, in diagrammatic form, the structure of a "thyristor," and its electrical contacts, FIG. 2 represents, in diagrammatic form, a modification of the thyristor structure in which a layer of low resistivity n type semiconductor material, known as n+, is inserted within the inner n type region, FIG. 3 represents, in diagrammatic form, the manner in which the n+ region may be used as a substrate on which the other regions may rest, FIG. 4 represents, in section, a silicon device which corresponds to the diagram in FIG. 3, and FIG. 5 represents, in section, a silicon device of the type illustrated in FIG. 4 in which an auxiliary control electrode has been introduced, FIG. 6 represents, in plan, a silicon device of the type illustrated in FIG. 5.

The mode of operation of a four layer device when used as an electrical switch has been described by J. L. Moll et al., "PNPN transistor switches," Proceedings of the Institute of Radio Engineers, volume 44, No. 9, September 1956, pp. 1174–1182. The term "thyristor" is now preferred for devices whose operation depends principally on this mechanism. Referring to FIGURE 1, when $I_B=O$, $I_E=I_C$. The junction 2 is reverse biassed and so the current given by the junction is given by:

$$I_C=I_{CO}+\alpha_1 I_C+\alpha_2 I_C$$

where $I_{CO}$ is the leakage current of the reverse biassed junction 2, $\alpha_1$ is the common base current gain of the npn transistor comprising junctions 1 and 2, and $\alpha_2$ is the common base current gain of the pnp transistor comprising junctions 2 and 3.

The above equation may be rearranged so as to be $$I_C=\frac{I_{CO}}{1-(\alpha_1+\alpha_2)}$$

It is evident that the device will switch from a substantially nonconducting to a conducting state if $(\alpha_1+\alpha_2)$ is greater than unity. The value of $\alpha_1$ may be effectively increased by causing base current $I_B$ to flow.

Because $\alpha_1$ may be increased by the addition of current $I_B$, it is not necessary for $\alpha_2$ to be large. It is possible to extend the current path between junctions 2 and 3, by increasing the width of the n type region so enclosed, and still maintain a device capable of being switched, as above. The impedance of the device will not be greatly increased if the n region width is increased by the interpolation of a low resistivity n region, known as an n+ region, as illustrated in FIG. 2. This n+ region is bounded by the nn+ junctions 4 and 5.

It is not necessary to arrange the various regions in a line as in FIG. 2. They may be so positioned that the added n+ layer is beside the relevant n layer, not within it. Such a configuration is illustrated in the diagram in FIG. 3. The junction 6 now takes the place of both junctions 4 and 5. Current crossing junction 2 will enter the n region 9 and will have two paths open to it in order to reach junction 3. The first path simulates the flow in FIG. 2, the current will cross the n region 9, as indicated by arrow 7, and flow along the n+ substrate 10 before reentering the n region 9 and again traversing it to reach the junction 3. The second path is more direct, as indicated by arrow 8, current will flow from junction 2 to junction 3, keeping within the n region, 9. The impedance ratio of the two available current paths 7 and 8 is dependent on the resistivity ratio of the two regions 9 and 10.

FIG. 4 illustrates, in section, a practical realisation of the configuration illustrated in FIG. 3. An n+ type silicon substrate wafer 10 has an n type layer epitaxially grown on one major surface. A double diffused npn transistor assembly is produced in the region 9 by the planar method of manufacture, the collector-base junction 2 being formed by the solid state diffusion of an acceptor element, such as boron, and the emitter-base junction 1 being formed by the solid state diffusion of a donor element, such as phosphorus, in a subsequent operation. In addition, at the same time as junction 2 is formed, a further discrete p type region is formed which is bounded by junction 3. Typical resistivities of the wafer are 0.01 ohm cm. n type for the substrate 10 and 2 ohm cm. n type for the epitaxial layer 9. The epitaxial layer 9 thickness is typically ten microns, the spacing of junctions 2 and 6 and of junctions 3 and 6 is typically five microns. The spacing of junctions 2 and 3, along the surface of the wafer, may be 0.004 inch (~100 microns) or more. It is evident that the lowest impedance path between junctions 2 and 3 is by way of the region 10 and most of the current will flow by that path (see arrow 7 in FIG. 3). However, the forward and reverse current gains of the pnp transistor, formed by junctions 2 and 3 in region 9, are sufficiently high for a significant proportion of the current to be carried within the region 9.

It is possible to produce an auxiliary electrode between junctions 2 and 3 by introducing a further junction 11, as illustrated in FIG. 5. This junction also encloses a p type region and is made by the diffusion of acceptors, such as boron, into the silicon. The auxiliary electrode may be used in the same way as is a gate electrode in a field effect transistor, i.e., a reverse bias applied to the junction produces a mobile charge depleted layer which restricts the available current path through which a given current flows. In this case the current path affected is that represented by the arrow 8 in FIG. 3.

Minority carrier lifetime is higher in lightly doped material than it is in heavily doped material. The current gain of the elementary pnp transistor formed by junctions 2 and 3 is therefore almost entirely due to holes drifting from 2 to 3 or vice versa by way of the epitaxial region 9. This current gain may be controlled by the depletion layer, caused by the reverse biassing of junction 11, sweeping across the epitaxial layer. A thyristor having such an electrode may be turned on in the normal manner by applying a positive-going pulse to the gate electrode 12 and turned off by applying a negative going pulse to the auxiliary gate electrode 13. The speed of turn-off is faster in this case than in the normal thyristor case in which a negative going pulse is applied to the gate electrode 12 or a positive going pulse is applied to region 9, because it is limited by the closeness of spacing of the junctions 2 and 11 rather than the thickness of the region of the device or even of the slice from which the device was made. Since the gate electrode serves to block the flow of holes between junctions 2 and 3 it may, with advantage completely surround one or both of these junctions.

A plan view of the device is illustrated in FIG. 6. This plan is taken from the exposure mask pattern used to manufacture devices such as those described. The junctions 3, 11 and 2 are made by diffusion of acceptors and are 30 mils x 6 mils, 24 mils x 13 mils (overall), and 15 mils x 9 mils in size. Junction 11 effectively surrounds junction 2, since the fourth side of the latter is adjacent to the edge of the wafer which acts as a recombination centre for minority carriers. The junction 1 is made by diffusion of donors and is 13 mils x 7 mils (overall) in size. The regions 12, 14 and 15 are metallised contacts. All junction terminations at the surface are covered with silicon oxide, as is normal with devices made by the planar technique. The particular device is intended to operate with an ON current of 500 milliamps and with a stand-off voltage at junction 2 of 140 volts.

A small "shorting dot" is incorporated in the junction 1, as indicated as item 16 in FIG. 6. This is a known method of reducing the low current gain of the npn portion of the thyristor. It is incorporated to prevent accidental switching of the device state by small voltage "spikes" appearing at the contacts from the external circuit.

Devices with similar operating characteristics may be made by reversing the sign of the carriers throughout and producing a PNPN structure in a p type wafer rather than the NPNP structure produced in the n type wafer. Other configurations than that illustrated in FIG. 6 would be suitable. The convenience of performing all diffusion operations from one side of the slice and of attached all the contacts to one side of the slice may also be utilised for devices of much lower or higher current carrying capability or voltage working. The single face contacts would make mounting possible by the method described in U.S. Patent No. 3,324,567.

The method of manufacture is not restricted to the normal planar technique. The new planar technique described in U.S. patent application Ser. No. 410,513, filed Nov. 12, 1964, now abandoned, could also be applied to some or all of the junctions. Other diffusion techniques, such as the mesa technique, would also be suitable for this purpose.

Silicon is a convenient semiconductor material for the manufacture of controlled rectifiers, but other materials, including intermetallic compounds, may also be used.

If a thyristor does not require a rapid turn-off it is permissible to omit the auxiliary gate.

It is to be understood that the foregoing description of specific examples of this invention is not to be considered as a limitation on its scope.

I claim:

1. A four layer semiconductor switching device comprising:

a substrate of one conductivity which provides a current path of low resistivity;

a first region of the same conductivity and of high resistivity adjacent to said substrate;

second and third regions of opposite conductivity formed within said first region on a major surface of said first region;

a fourth region of said one conductivity formed within said second region on said surface;

ohmic metallic contacts attached to said second, third and fourth regions;

and a fifth region of opposite conductivity formed within said first region between said second and third regions, a metallic contact attached to said fifth region, said fifth region being so disposed in relation to said second and third regions as to control by means of field effect the flow of minority carriers within said first region between said second and third regions whereby the turn off speed of the device is thus increased.

2. A device defined in claim 1 wherein said fifth region partially surrounds said second region.

3. The device defined in claim 1 wherein said ohmic contacts are all attached to the same side of the slice of semiconductor material.

References Cited

UNITED STATES PATENTS

| | | | |
|---|---|---|---|
| 2,754,431 | 7/1956 | Johnson | 317—235 |
| 3,302,041 | 1/1967 | Poston | 307—305 |
| 3,335,340 | 8/1967 | Barson et al. | 317—235 |

FOREIGN PATENTS

| | | |
|---|---|---|
| 1,325,810 | 12/1963 | France. |

OTHER REFERENCES

GE Transistor Manual, seventh edition, page 393, 1964.

JOHN W. HUCKERT, *Primary Examiner.*

J. D. CRAIG, *Assistant Examiner.*